(12) United States Patent
Hosoda et al.

(10) Patent No.: US 6,738,402 B1
(45) Date of Patent: May 18, 2004

(54) SEMICONDUCTOR DEVICE WITH MULTIPLE LASER RESONATORS

(75) Inventors: Masahiro Hosoda, Yamatotakada (JP); Tadashi Takeoka, Tenri (JP); Atsuo Tsunoda, Yamatokotiyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/499,027

(22) Filed: Feb. 7, 2000

(30) Foreign Application Priority Data

Feb. 8, 1999 (JP) .......................................... 11-030155

(51) Int. Cl.$^7$ ................................................ H01S 5/00
(52) U.S. Cl. ........................... 372/43; 372/44; 372/45; 372/46; 372/47; 372/48; 372/49; 372/50
(58) Field of Search .............................. 372/43–50, 36, 372/26, 23

(56) References Cited

U.S. PATENT DOCUMENTS

| | | | | |
|---|---|---|---|---|
| 3,999,146 A | * | 12/1976 | Lang et al. | 372/26 |
| 5,699,375 A | * | 12/1997 | Paoli | 375/50 |
| 5,793,790 A | * | 8/1998 | Doi et al. | 372/50 |
| 5,872,022 A | * | 2/1999 | Motoda et al. | 438/39 |
| 5,963,568 A | * | 10/1999 | Paoli | 372/23 |
| 5,974,069 A | * | 10/1999 | Tanaka et al. | 372/45 |
| 6,274,891 B1 | * | 8/2001 | Tanaka et al. | 257/67 |
| 6,298,079 B1 | * | 10/2001 | Tanaka et al. | 372/45 |

OTHER PUBLICATIONS

Electronic Material, the June. issued in 1996, pp. 38.
Japanese Unexamined Patent Publication Hei 11 (1999)–97804.
Japanese Unexamined Patent Publication Hei 11(1991)–9589.
Japanese Unexamined Patent Publication Sho 61(1986)–19186.
Japanese Unexamined Patent Publication Hei 6(1994)–29618.
Japanese Unexamined Patent Publication Hei 10(1998)–233550.

* cited by examiner

Primary Examiner—Paul Ip
Assistant Examiner—Delma R. Flores Ruiz
(74) Attorney, Agent, or Firm—Nixon & Vanderhye P.C.

(57) ABSTRACT

By using a single semiconductor laser device, laser beams in infrared and red regions are generated at a distance between close light emitting spots. A semiconductor laser resonator having an oscillation wavelength in an infrared region and a semiconductor laser resonator having an oscillation wavelength in a red region are formed in parallel on the same semiconductor substrate.

14 Claims, 10 Drawing Sheets

SEMICONDUCTOR DEVICE WITH MULTIPLE LASER RESONATORS

CROSS-REFERENCES TO RELATED APPLICATIONS

This application is related to Japanese patent application No. HEI 11(1999)-30155 filed on Feb. 8, 1999 whose priority is claimed under 35 USC §119, the disclosure of which is incorporated herein by reference in its entirety.

BACKGROUND OF THE INVENTION

1. Field of the Invention

The preset invention relates to a semiconductor laser device and a method of manufacturing the semiconductor laser device, and more particularly to a semiconductor laser device to be used for an optical information recording and reproducing apparatus and a method of manufacturing the semiconductor laser device.

2. Description of the Related Art

A DVD (Digital Versatile Disk) which is a next generation optical disk is characterized by the reproduction of dynamic images for 135 minutes as video recording and a capacity of 4.7 gigabytes as information recording and the like.

In a DVD reproducing apparatus, it is desired that the reproducing and data reading operations of a CD, a CD-ROM and a CD-R which have conventionally been used widely can be carried out in addition to the reproducing and data reading operations of a DVD (video recording), a DVD-ROM (informations recording) and a DVD-R (information recording using one-time writing).

However, since the DVD is greatly different from the CD in the following two respects, it has difficulties in obtaining the compatibility of a system.

In a first respect, while a substrate of a disk of the CD has a thickness of 1.2 mm, that of a disk of the DVD has a thickness of 0.6 mm. The reason is that a tolerance to the inclination of the disk should be kept when the NA (numerical aperture) of a collective lens is increased to raise a recording density.

In a second respect, the oscillation wavelength of a semiconductor lasers to be used for a pick-up is given. A collective spot diameter on the disk is proportional to the wavelength. Therefore, the CD uses a semiconductor laser having a 780 nm band (an infrared region), while the DVD uses a semiconductor laser having a 650 nm band (a red region) in order to implement high density recording.

For the pick-up for reading information recorded on the disk, the two kinds of disks having different substrate thicknesses are obstacles to the aberration of an Optical system. As a solution, the following method is currently known Examples of the solution include a method using two lenses for the CD and the DVD by switching, a method using a bifocal lens, a method using a liquid crystal shutter and the like (see Electronic Material, the June issue in 1996, pp. 38). By using these methods, the information of the disks having different substrate thicknesses can be read out and the reading operations of the CD and CD-ROM can be carried out by the DVD reproducing apparatus.

According to the above-mentioned methods, however, the information of the CD-R used for a method of recording a dye reacting to light having a 780 nm band cannot be reproduced by the DVD reproducing apparatus including a light source having a 650 nm band. For this reason, the following methods have been proposed as a pick-up for a DVD capable of reproducing the information of the CD-R.

As a first method, a pick-up for a CD (using a laser having a 780 nm band) and a picks-up for a DVD (using a laser having a 650 nm band) are provided in a reproducing apparatus. In this case, however, the apparatus becomes large-sized and a cost is increased.

As a second method, a semiconductor laser emitting light having two kinds of wavelengths is incorporated in one pick-up. The following method has been proposed.

① Two kinds of laser chips having different oscillation wavelengths are provided in a semi conductor laser package (see Japanese Laid-Open Patent Publication No. Hei 11(1999)-97804).

② By changing a thickness of a coating film for adjacent resonators of one laser chip, an oscillating operation is carried out with different wavelengths (see Japanese Laid-Open Patent Publication No. Hei 3(1991)-9589).

③ For adjacent resonators of one laser chip, the width of a groove provided under an active layer is varied and the Al content of the active layer is varied. Thus, an oscillation wavelength is changed (see Japanese Laid-Open Patent Publication No. Sho 61(1986)-19186).

In the case where a semiconductor laser emitting light having two kinds of wavelengths is thus incorporated in one pick-up, a distance between light emitting spots causes troubles in the above-mentioned ①. More specifically, a distance between light emitting spots should be at least 100 $\mu$m or less in order to treat the light having two different wavelengths by using the same lens in an optical system of a pick-up. However, it is usually hard to set the distance between the light emitting spots to 100 $\mu$m or less in order to arrange two independent laser chips in a package in parallel, and an error of approximately several tens $\mu$m is also made during the arrangement.

In the above-mentioned ② and ③, moreover, since two light emitting points are simultaneously formed at the one-time crystal growing step, the active layer is formed of the same component. Consequently, a difference in a wavelength of approximately 10 nm is made between the two light emitting points by using any method. Therefore, it is impossible to implement two oscillation wavelengths of 650 nm and 780 nm which are necessary for the DVD and the CD.

SUMMARY OF THE INVENTION

In consideration of such circumstances, it is an object of the present invention to provide a semiconductor laser device capable of generating laser beams in an infrared region and a red region at a distance between close light emitting spots and a method of manufacturing the semiconductor laser device.

The present invention provides a semiconductor laser device wherein a plurality of semiconductor laser resonators having light emitting layers using materials different from each other are provided on the same semiconductor substrate in parallel with a main surface of the semiconductor substrate and a high-resistance region is provided between the semiconductor laser resonators.

According to the present invention, the semiconductor laser resonators having the light emitting layers using materials different from each other are arranged in parallel with the main surface of the semiconductor substrate. Therefore, it is possible to generate a plurality of laser beams in different wavelength regions at a distance between close light emitting spots in parallel.

According to the present invention, the laser beams in the infrared and red regions can be generated at the distance between the close light emitting spots by using a single semiconductor laser device.

This object as well as other objects, features and advantages of the invention will become more apparent to those skilled in the art from the following description with reference to the accompanying drawings.

DETAILED DESCRIPTION OF THE PREFERRED EMBODIMENTS

In the present invention, various substrates can be used for a semiconductor substrate. Examples of the semiconductor substrate include n or p type GaAs, InP and GaN substrates and the like.

A semiconductor laser resonator is formed by laminating semiconductor layers on a semiconductor substrate such that an active layer having a gain is sandwiched between clad layers and providing mirrors at end facets. This structure is generally called a double hetero structure. Since light is emitted from the active layer, the active layer is also called a light emitting layer. In the semiconductor laser resonator, electrodes are formed on the top portion of the semiconductor layers and on a semiconductor substrate side. The electrodes are connected to a power source. Laser light is emitted from the light emitting layer when electric current flows across the electrodes.

In the present invention, the light emitting layers of the plural semiconductor laser resonators contain Group V elements which are different from each other. Usually, light emitting layers of semiconductor laser resonators are composed of materials containing Group III elements and Group V elements. In the present invention, it is sufficient that the light emitting layers contain different Group V elements. They may contain the same or different Group III element (s). Examples of the Group III elements are Ga, Al, In, B and the like and examples of the Group V elements are P, As, N, Sb and the like.

Although a plurality of semiconductor laser resonators can have any oscillation wavelength, they are desirably constituted by two resonators, that is, a resonator having an oscillation wavelength in a red region and a resonator having an oscillation wavelength in an infrared region. The oscillation wavelength in the infrared region indicates that light having a wavelength of approximately 780 nm is generated, and the oscillation wavelength in the red region indicates that light having a wavelength of a 650 nm band is generated.

With such a structure, if the semiconductor substrate is a GaAs substrate, it is preferable that a light emitting layer should be formed of a InGaP based material for the resonator having an oscillation wavelength in a red region and be formed of a GaAs based material for the resonator having an oscillation wavelength in an infrared region. Since the InGaP based material can be equivalently substituted for Ga and Al, it implies $InGa_xAl_{1-x}P$ ($0 \leq X \leq 1$). Moreover, the GaAs based material implies $Ga_xAl_{1-x}As$ ($0 \leq X \leq 1$).

Moreover, if the semiconductor substrate is formed of InP, for example, the light emitting layer of one of the resonators may be formed of InGaAsP and that of the other resonator may be formed of InGaNSb. Alternatively, if the semiconductor substrate is formed of GaN, for example, the light emitting layer of one of the resonators may be formed of InGaN and that of the other resonator may be formed of InBP or InBAs. Since the resonator including the light emitting layer formed of InGaAsP has an outgoing wavelength of 1.3 to 1.5 $\mu$m, it can be utilized for fiber optic communication. Furthermore, since the resonator including the light emitting layer formed of InGaNSb has an outgoing wavelength of 2 $\mu$m or more, it can be utilized for long-distance fiber optic communication.

By selecting the material of the light emitting layer as described above, a plurality of semiconductor laser resonators having light emitting layers using materials of the Group V which are different from each other can be provided on the semiconductor substrate.

It is desirable that a plurality of semiconductor laser resonators should have the light emitting layers provided in positions having almost the same heights with respect to a main surface of the semiconductor substrate. The main surface of the semiconductor substrate implies a common face to be a base for forming the semiconductor laser resonators. Moreover, it is desirable that the semiconductor laser resonators should have a refractive index wave-guiding structure, respectively.

Preferably, a high-resistance region has a sufficient resistance for electrically isolating the adjacent semiconductor laser resonators, and can be formed as an air gap for taking in air to perform insulation, as a high-resistance semiconductor layer having a higher resistivity than peripheral semiconductors, and the like. The high-resistance semiconductor layer can be formed by forming a stripe-shaped groove in the semiconductor layers of the semiconductor laser resonator and implanting protons or gallium ions in a wall of the groove to raise the resistivity of the wall.

The semiconductor laser device is usually incorporated for use in an optical pick-up in a recording and reproducing apparatus capable of performing the recording and reproducing operations for both a CD and a DVD.

An aspect of the present invention is directed to a semiconductor laser device characterized in that a semiconductor laser resonator having an oscillation wavelength in an infrared region and a semiconductor laser resonator having an oscillation wavelength in a red region are formed in parallel on the same semiconductor substrate.

According to the aspect of the present invention, the semiconductor laser device can be constituted by forming a first semiconductor laser resonator having an oscillation wavelength in an infrared region (or a red region) in a half area of the semiconductor substrate, then forming a stripe-shaped groove in the residual half area of the same semiconductor substrate in parallel with a main surface of the semiconductor substrate, and forming, in the groove, a second semiconductor laser resonator having an oscillation wavelength in a red region (or an infrared region). In this case, the isolation of the first resonator and the second resonator through a current path can be achieved by providing a high-resistance region such as a sufficient air gap for electrically isolating the two resonators between the first and second resonators.

The high-resistance region may be formed by a high-resistivity semiconductor layer having a sufficient resistance for electrically isolating the two resonators. The high-resistivity semiconductor layer desirably has such a structure that wall surfaces (a side surface and a bottom surface) of the stripe-shaped groove are formed of a high-resistance layer and a current path is provided on a part of the high-resistance layer. The current path can be formed by reducing the resistivity of a part of the high-resistivity semiconductor layer with impurity diffusion or removing a part of the high-resistivity semiconductor layer.

In this case, a stable transverse mode oscillation can be implemented by a refractive index wave-guiding type structure of the second resonator provided in the stripe-shaped groove.

According to the semiconductor laser device of the present invention a surface can be flattened. Therefore, the semiconductor laser device can be mounted on a package with a junction-down by isolating the heat sink (radiation) side of the package into portions corresponding to the first and second resonators, respectively.

Another aspect of the present invention is directed to a method of manufacturing a semiconductor laser device, comprising the steps of forming a first semiconductor laser resonator having a light emitting layer using a predetermined material on a semiconductor substrate, forming an opening in parallel with a main surface of the semiconductor substrate in the vicinity of the first semiconductor laser resonator, forming a second semiconductor laser resonator having a light emitting layer using a material different from the material of the first semiconductor laser resonator in the opening in parallel with the main surface of the semiconductor substrate, and forming a high-resistance region between the first and second semiconductor laser resonators.

According to the manufacturing method, the first semiconductor laser resonator is formed on the semiconductor substrate, the opening is formed in the vicinity of the first semiconductor laser resonator, the second semiconductor laser resonator having a light emitting layer using a material different from the material of the first semiconductor laser resonator is formed in the opening, the high-resistance region is formed between the first and second semiconductor laser resonators, and the first and second semiconductor laser resonators are electrically isolated from each other by the high-resistance region. Therefore, it is possible to closely provide the two resonators which include the light emitting-layers using materials different from each other and have different oscillation wavelengths. Consequently, a spacing between close light emitting points of the two resonators having different oscillation wavelengths can be implemented with high precision.

Yet another aspect of the present invention is directed to a method of manufacturing a semiconductor laser device, comprising the steps of forming a first semiconductor laser resonator having a light emitting layer using a predetermined material on a semiconductor substrate, forming a stripe-shaped groove in parallel with a main surface of the semiconductor substrate in the vicinity of the first semiconductor laser resonator, forming a high-resistance semiconductor layer on a wall surface and a bottom surface in the stripe-shaped groove, forming a current path on a part of the high-resistivity semiconductor layer, and forming a second semiconductor laser resonator having a light emitting layer using a material different from the material of the first semiconductor laser resonator in the stripe-shaped groove in parallel with the main surface of the semiconductor substrate. In the manufacturing method, when the semiconductor laser resonator is to be formed, a part of a double hetero structure is removed to form a ridge type waveguide stripe. Consequently, a stable transverse mode oscillation can be implemented.

According to the manufacturing method, the first semiconductor laser resonator is formed on the semiconductor substrate, the stripe-shaped groove is formed in the vicinity of the first semiconductor laser resonator, the high-resistivity semiconductor layer is formed on the wall surface and the bottom surface in the groove, the current path is formed on a part of the high-resistivity semiconductor layer, the second semiconductor laser resonator having a light emitting layer using a material different from the material of the first semiconductor laser resonator is formed in the stripe-shaped groove, and the first and second semiconductor laser resonators are electrically isolated from each other by the high-resistivity semiconductor layer. Therefore, it is possible to closely provide the two semiconductor laser resonators which include the light emitting layers using materials different from each other and have different oscillation wavelengths. Consequently, a spacing between close light emitting points of the two resonators having different oscillation wavelengths can be implemented with high precision.

According to the present invention, the light emitting layers of the semiconductor laser resonators are formed at separate epitaxial growing steps. Therefore, a crystal material can be selected independently, and an oscillation wavelength can easily be set separately to 780 nm and 650 nm, for example.

According to the present invention, moreover, the semiconductor laser resonators can be arranged in a transverse direction and the surface can easily be flattened. Therefore, it is possible to perform junction-down type mounting on the electrically isolated heat sink, and the present invention is also advantageous to the high temperature operation of the laser device. Furthermore, the semiconductor laser device is isolated through the air, which has no rigidity, or the high-resistivity semiconductor layer having a thermal conductivity equal to the thermal conductivity of the semiconductor layers of the semiconductor laser device. Therefore, the semiconductor laser device is not affected by thermal expansion or the like caused by heat generation during the operation.

An optical disk pick-up using the above-mentioned semiconductor laser device can emit light having 780 nm and 650 nm bands by means of one semiconductor laser chip. Therefore, it is possible to read the information of disks for a CD, a CD-ROM and a CD-R as well as a disk for a DVD.

Preferred embodiments of the present invention will be described below in detail with reference to the drawings. The present invention is not restricted to the following embodiments.

First Embodiment

Figure 1:
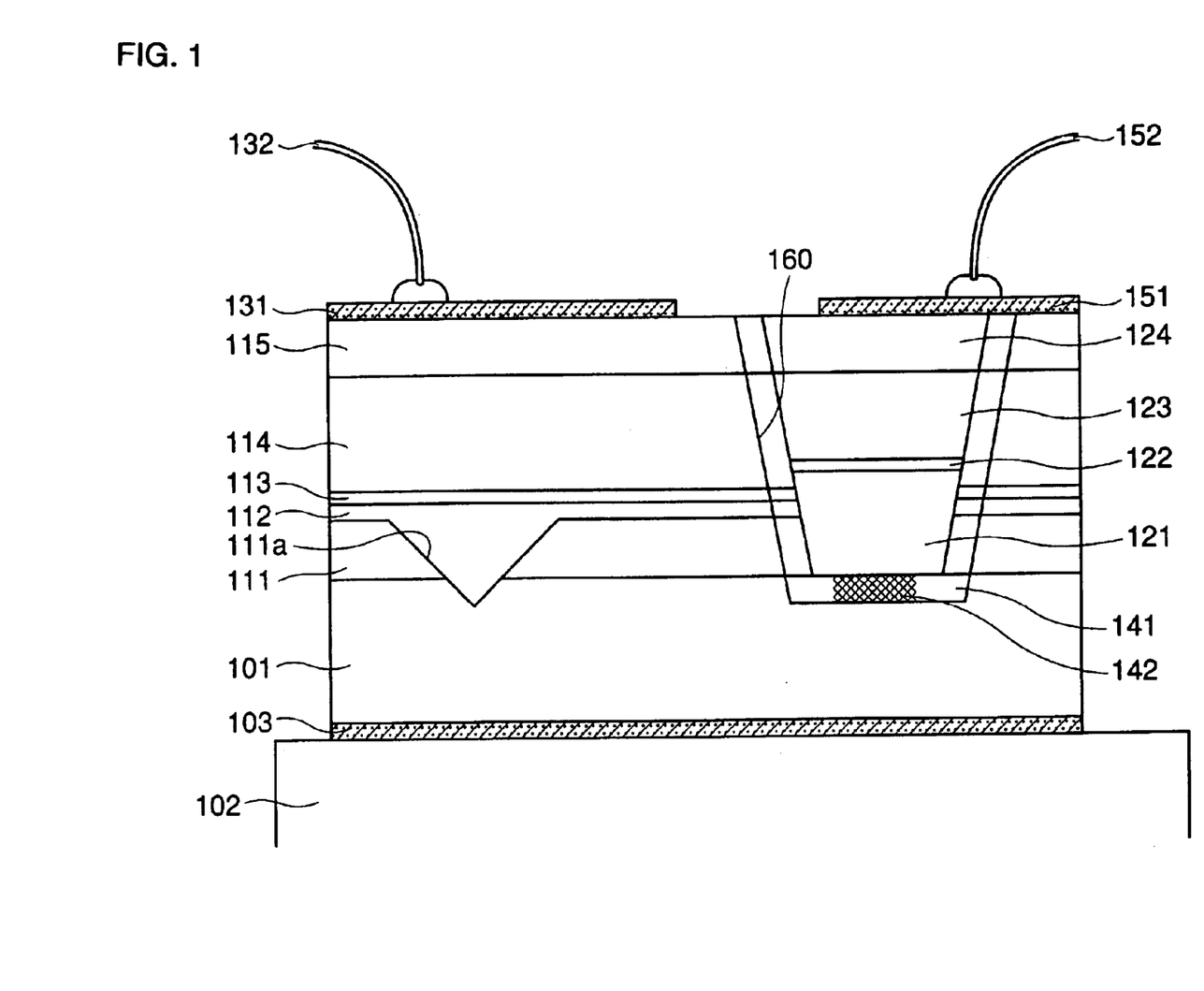
FIG. 1 is a view illustrating a section of a semiconductor laser device according to a first embodiment of the present invention.

FIG. 1 is a view illustrating a section of a semiconductor laser device according to a first embodiment of the present invention. The semiconductor laser device has such a structure that a semiconductor laser chip is fused onto a heat sink (submount) 102 having a radiating action. The semiconductor laser chip includes two resonators which oscillate at wavelengths of 780 nm and 650 nm, respectively.

In FIG. 1, the reference numeral 101 denotes a p-GaAs substrate, the reference numeral 111 denotes an n-GaAs current confinement layer, the reference numeral 111a denotes a V-groove stripe, the reference numeral 112 denotes a p-AlGaAs clad layer, the reference numeral 113 denotes an AlGaAs active layer, the reference numeral 114 denotes an n-AlGaAs clad layer, the reference numeral 115 denotes an n-GaAs cap layer, the reference numeral 160 denotes a U type stripe-shaped groove, the reference numeral 141 denotes a high-resistance layer, the reference numeral 142 denotes a low resistance layer, the reference numeral 121 denotes a p-AlGaInP clad layer, the reference numeral 122 denotes a GaInP active layer, the reference numeral 123 denotes an n-AlGaInP clad layer, the reference numeral 124 denotes an n-GaAs cap layer, the reference numeral 103 denotes a common p-type electrode, the reference numerals 131 and 151 denote an n-type electrode, the reference numeral 132 denotes a lead wire connected to the electrode 131, and the reference numeral 152 denotes a lead wire connected to the electrode 151.

The electrode provided on the top surface of the semiconductor laser chip is divided into the electrode 131 for 780 nm light emission in an infrared region and the electrode 151 for 650 nm light emission in a red region. When a current is caused to flow between the electrodes 131 and 151 and the common electrode 103 provided on the underside, light can be emitted at respective wavelengths.

FIGS. 2(a)–2(c) and 3(d)–3(f) are views illustrating a method of manufacturing the semiconductor laser device according to the first embodiment. With reference to these drawings, the method of manufacturing the semiconductor laser device according to the first embodiment will be described in order of the steps. These figures show only portions corresponding to a set of semiconductor lasers in one wafer.

First of all, the n-GaAs current confinement layer 111 is formed on the p-GaAs substrate 101 by a MOCVD(metal organic chemical vapor deposition) method. Then, the V-groove stripe 111a is formed by photolithography and a chemical etching method. Subsequently, the p-AlGaAs clad layer 112, the AlGaAs active layer 113, the n-AlGaAs clad layer 114 and the n-GaAs cap layer 115 are provided by a LPE (liquid phase epitaxial) method (see FIG. 2(a)). Thus, a first semiconductor laser resonator having a double hetero structure is formed. The laser resonator having such a structure emits light at a wavelength of 780 nm.

Figure 2A:
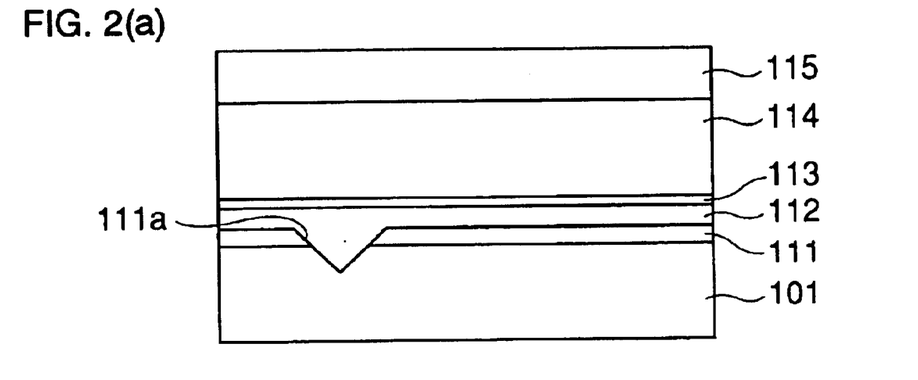
FIGS. 2(a) to 2(c) are views illustrating a method of manufacturing the semiconductor laser device according to the first embodiment of the present invention.
Figure 2B:
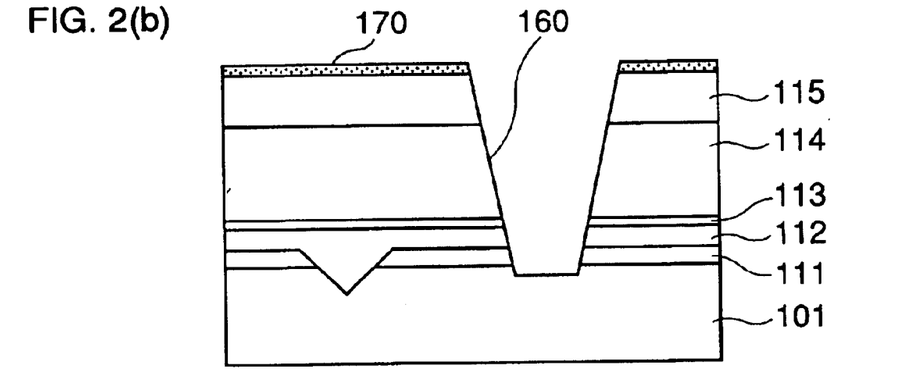

Next, an aluminum oxide (e.g., $Al_2O_3$, AlO, $Al_2O$, $AlO_2$, etc.) film 170 is formed on the first resonator by EB evaporation, and a U type stripe-shaped groove 160 having such a depth as to reach the p-GaAs substrate 101 is formed close to the V-groove stripe 111a by the photolithography and the chemical etching method (see FIG. 2(b)).

Figure 2C:
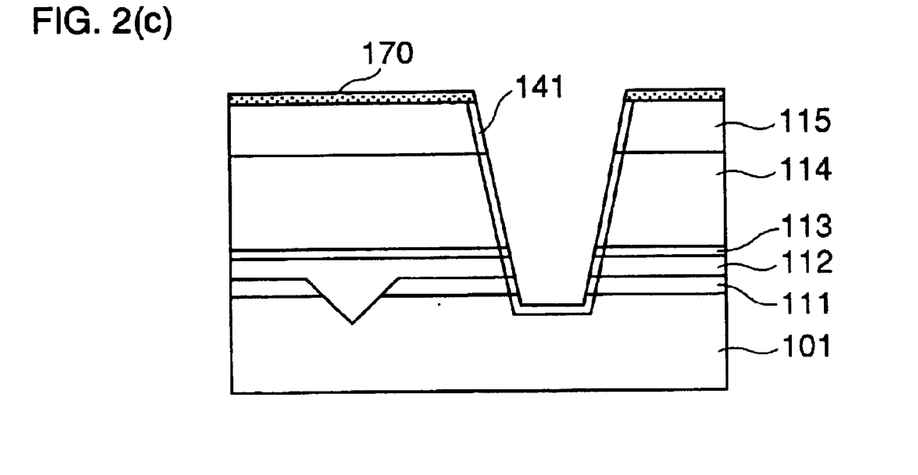
Figure 3D:
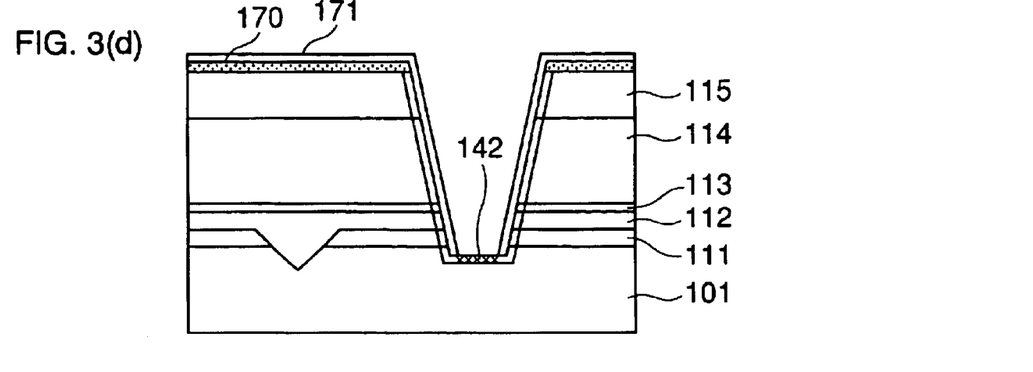
FIGS. 3(d) to 3(f) are views illustrating the method of manufacturing the semiconductor laser device according to the first embodiment of the present invention.
Figure 3E:
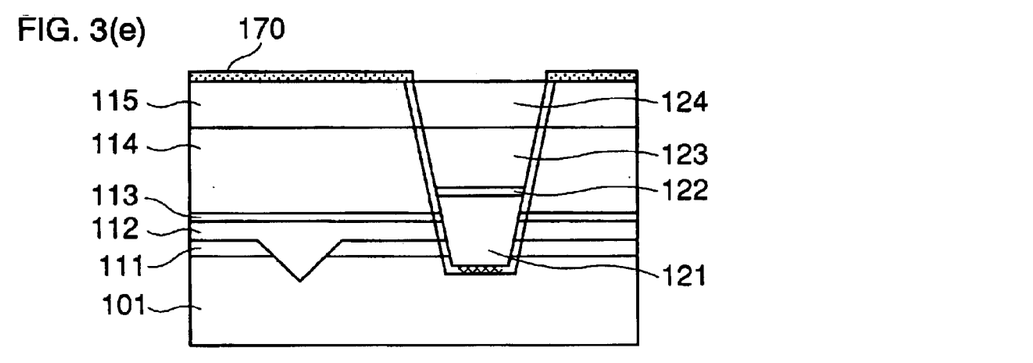
Figure 3F:
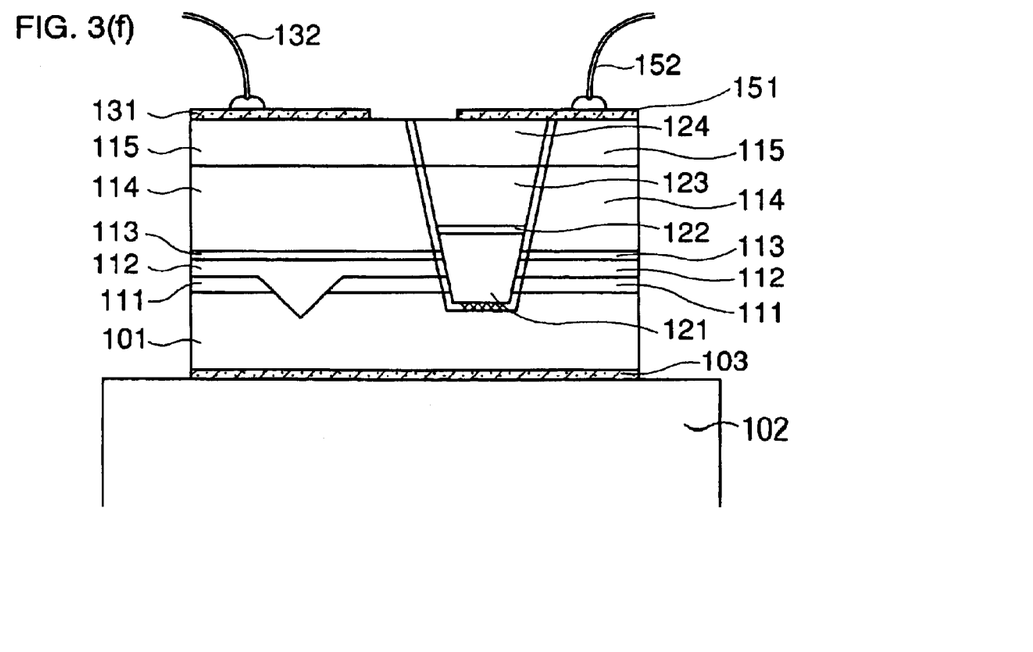

Then, proton radiation is carried out to form the high-resistance layer 141 on the side wall and bottom surface of the groove 160 (see FIG. 2(c)). The high-resistance layer 141 can also be formed by implanting gallium ions in place of the proton radiation.

Next, a SiNx film 171 is formed by a p (plasma)-CVD method. Then, the SiNx film 171 in the bottom portion of the groove 160 is removed by using the photolithography and the chemical etching technique. Thereafter, impurity diffusion is carried out to reduce the resistivity of only the bottom portion of the groove 160. Consequently, the low-resistance layer 142 is formed (see FIG. 3(d)).

Subsequently, the SiNx film 171 is removed to form a second semiconductor laser resonator having a double hetero structure using the aluminum oxide film 170 as a mask by the MOCVD method. The second semiconductor laser resonator comprises the p-AlGaInP clad layer 121, the GaInP active layer 122, the n-AlGaInP clad layer 123 and the n-GaAs cap layer 124 in the groove 160 (see FIG. 3(e)). The laser resonator having such a structure emits light at a wavelength of 650 nm.

Then, the aluminum oxide film 170 is removed to form the common p-type electrode 103 on the p-GaAs substrate 101 side and the n-type electrodes 131 and 151 isolated by a lift-off method on the n-GaAs cap layer 115 and 124 side. The lead wires 132 and 152 are connected to the electrodes 131 and 151, respectively (see FIG. 3(f)).

By dividing a wafer thus fabricated and performing facet coating and package mounting, the semiconductor laser device is obtained.

In the semiconductor laser device according to the present embodiment, the 780 nm light emitting portion oscillated with a threshold current of 40 mA and the 650 nm light emitting portion oscillated with a threshold current of 70 mA. An operating time of 2,500 hours was obtained at any wavelength under the condition of 70° C. and 5 mW.

Second Embodiment

Figure 4:
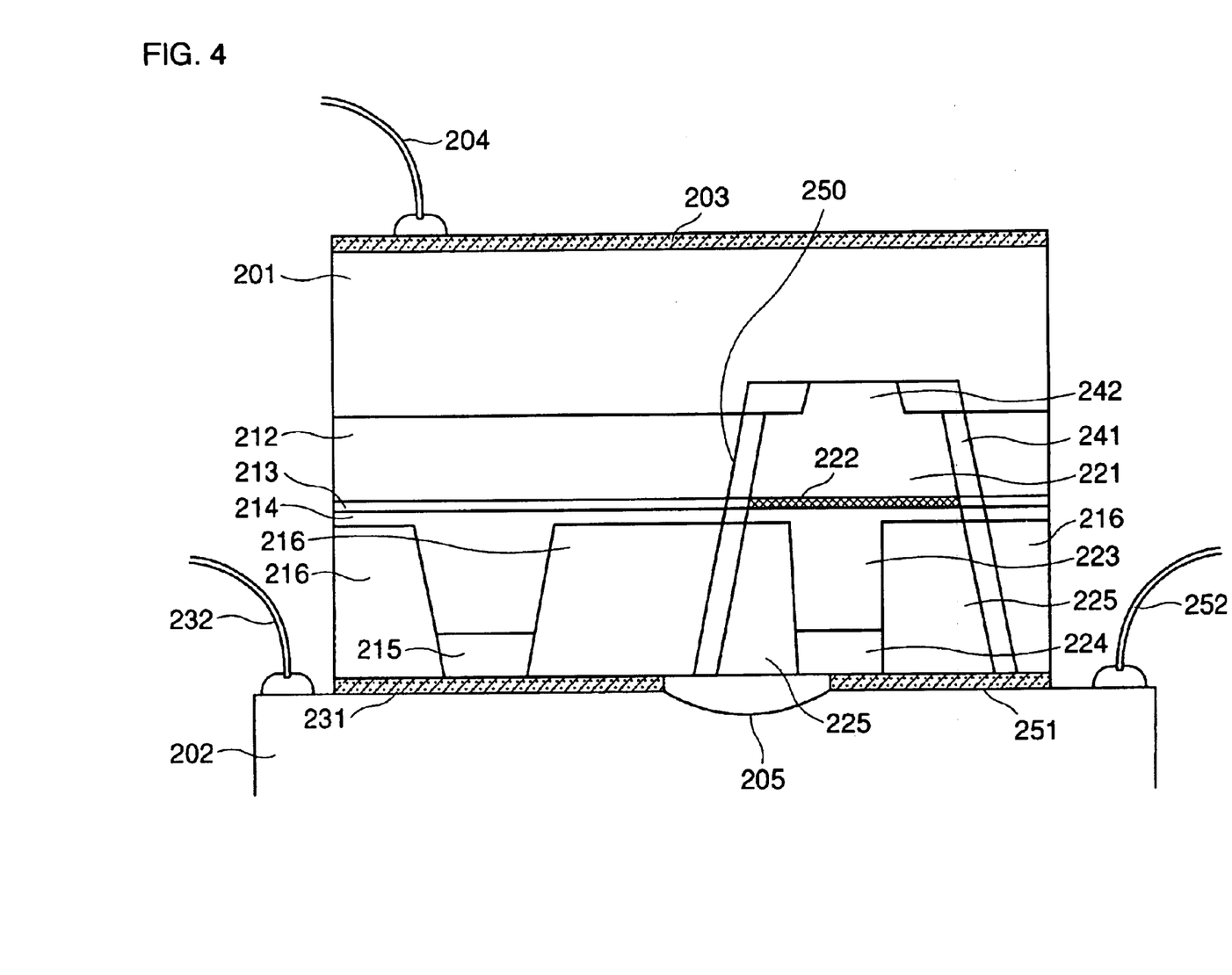
FIG. 4 is a view illustrating a section of a semiconductor laser device according to a second embodiment of the present invention.

Next, description will be given to a semiconductor laser device according to a second embodiment of the present invention. FIG. 4 is a view illustrating a section of the semiconductor laser device according to the second embodiment.

The semiconductor laser device has such a structure that a semiconductor laser chip is fused onto a heat sink 202 with a junction-down. The junction-down implies that the cap layer side of the semiconductor laser chip is connected to the heat sink 202 to cause an active layer (junction) portion interposed between clad layers to approach the heat sink 202.

The heat sink 202 is composed of insulating SiC and has a concave portion 205 formed thereon. Therefore, a surface has two electrically isolated sections.

In FIG. 4, the reference numeral 201 denotes an n-GaAs substrate, the reference numeral 212 denotes an n-AlGaInP clad layer, the reference numeral 213 denotes an MQW (Multi-Quantum-Well) active layer of AlGaInP/GaInP, the reference numeral 214 denotes a p-AlGaInP clad layer, the reference numeral 215 denotes a p-GaAs cap layer, the reference numeral 216 denotes an n-GaAs current blocking layer, the reference numeral 250 denotes a stripe-shaped groove, the reference numeral 241 denotes a high-resistivity layer, the reference numeral 242 denotes a current path, the reference numeral 221 denotes an n-AlGaAs clad layer, the reference numeral 222 denotes an MQW active layer of AlGaAs/GaAs, the reference numeral 223 denotes a p-AlGaAs clad layer, the reference numeral 224 denotes a p-GaAs cap layer, the reference numeral 225 denotes an n-GaAs current blocking layer, the reference numerals 203, 231 and 251 denote an electrode, the reference numeral 204 denotes a lead wire connected to the electrode 203, the reference numeral 232 denotes a lead wire connected to the electrode 231, and the reference numeral 252 denotes a lead wire connected to the electrode 251.

The laser resonator comprises the MQW active layer 222 of AlGaAs/GaAs for oscillating at a wavelength of 780 nm and the MQW active layer 213 of AlGaInP/GaInP for oscillating at a wavelength of 650 nm which have the independent electrodes 251 and 231, respectively. Therefore it is possible to independently control light emission at wavelengths of 780 nm and 650 nm by causing a current to flow between the electrodes 251 and 231 and the common electrode 203.

FIGS. 5(a)–5(d) and 6(e)–6(h) are views illustrating a method of manufacturing the semiconductor laser device according to the second embodiment. With reference to these drawings, the method of manufacturing the semiconductor laser device according to the second embodiment will be described in order of the steps.

First of all, the n-AlGaInP clad layer 212, the MQW active layer 213 of AlGaInP/GaInP, the p-AlGaInP clad layer 214 and the p-GaAs cap layer 215 are provided on the n-GaAs substrate 201 by a MBE (molecular beam epitaxial) method. Then, a portion other than a portion to be a ridge type waveguide stripe is removed by etching up to the middle of the p-AlGaInP clad layer 214. Next, the n-GaAs current blocking layer 216 is formed by the MBE method in the portion removed by the etching (see FIG. 5(a)). Consequently, a first semiconductor laser resonator with a double hetero structure and a refractive index wave-guiding type structure having a ridge type waveguide stripe is formed. The laser resonator having such a structure emits light at a wavelength of 650 nm.

Figure 5A:
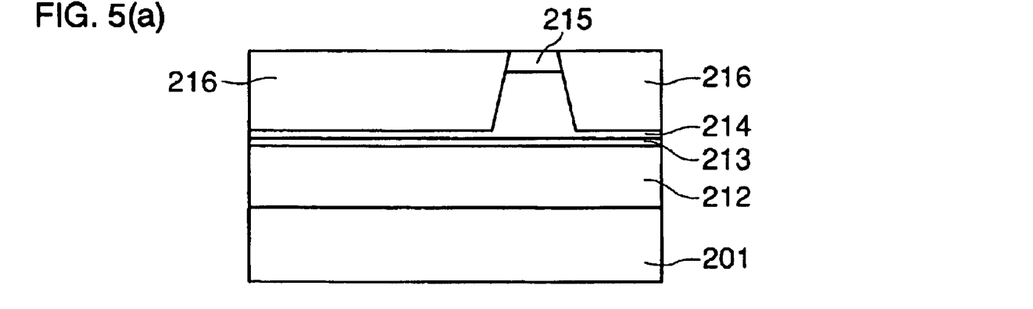
FIGS. 5(a) to 5(d) are views illustrating a method of manufacturing the semiconductor laser device according to the second embodiment of the present invention.
Figure 5B:
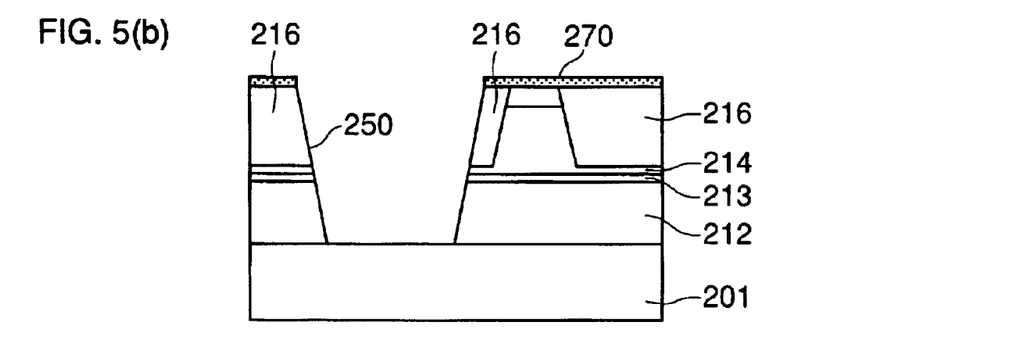
Figure 5C:
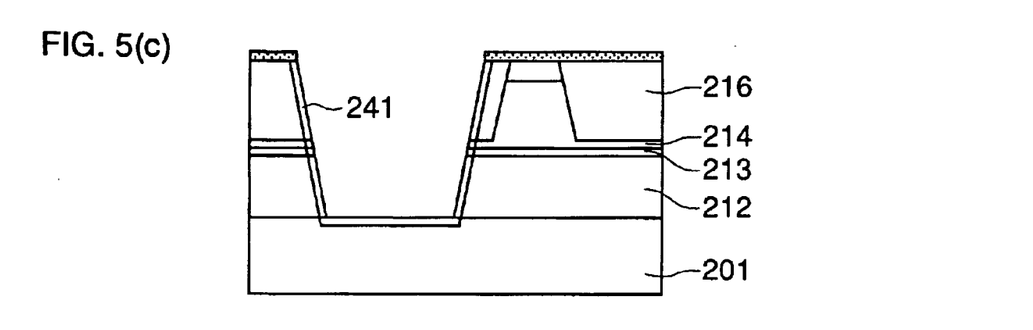
Figure 5D:
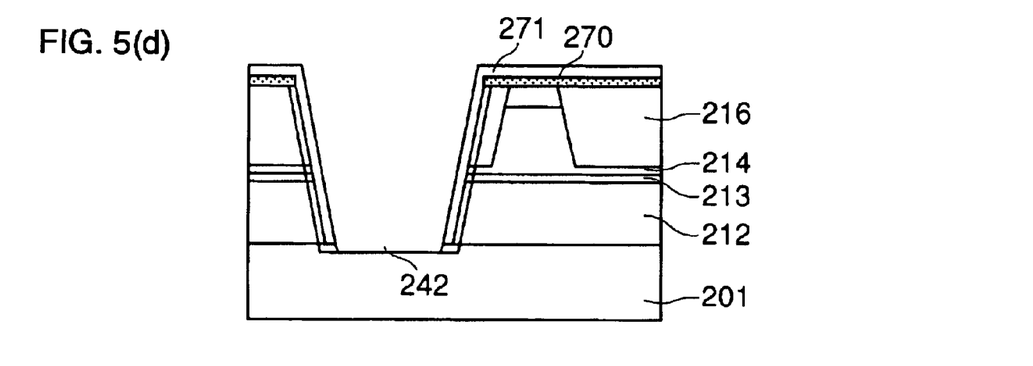

In the same manner as in the first embodiment, subsequently, the stripe-shaped groove 250 having such a depth as to reach the n-GaAs substrate 201 is formed (see FIG. 5(b)) to change the side wall and bottom surface of the groove 250 into the high-resistance layer 241 (see FIG. 5(c)).

Then, a portion other than the bottom surface of the groove 250 is protected by a photoresist 271 to remove the high-resistance layer 241 on the bottom surface of the groove 250 by a chemical etching method. Consequently, the current path 242 is formed (see FIG. 5(d)). The current path 242 may be formed by performing impurity diffusion to reduce the resistivity of only the bottom portion of the groove 250 in the same manner as in the first embodiment.

Figure 6E:
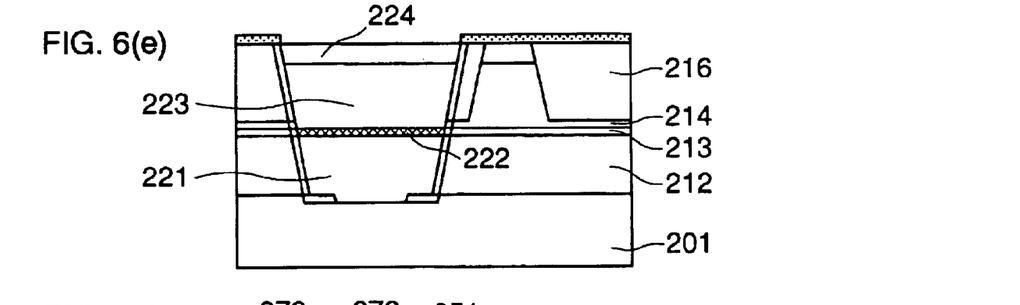
FIGS. 6(e) to 6(h) are views illustrating the method of manufacturing the semiconductor laser device according to the second embodiment of the present invention.
Figure 6F:
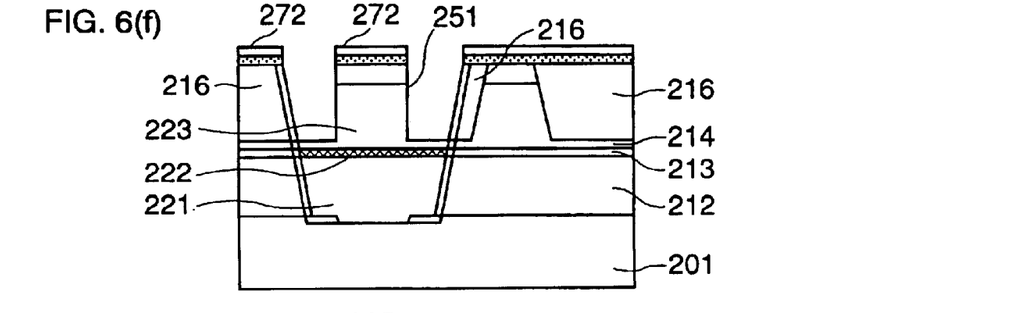
Figure 6G:
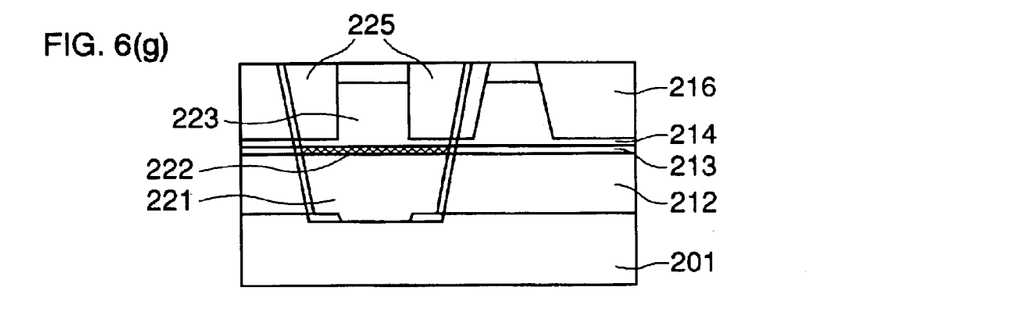

Thereafter, the n-AlGaAs clad layer 221, the MQW active layer 222 of AlGaAs/GaAs, the p-AlGaAs clad layer 223 and the p-GaAs cap layer 224 are provided in the groove 250 by a MOCVD method (see FIG. 6(e)).

By using a SiNx film 272 as a mask, a part of an AlGaAs based double hetero structure provided in the groove 250 is removed by a dry etching method up to the middle of the p-AlGaAs clad layer 223. More specifically, portion other than a portion to be a ridge type waveguide stripe in the groove 250 is removed by etching (see FIG. 6(f)). The n-GaAs current blocking layer 225 is formed in the removed portion (see FIG. 6(g)). Consequently, a second semiconductor laser resonator with a double hetero structure and a refractive index wave-guiding type structure having a ridge type waveguide stripe is formed. The laser resonator having such a structure emits light at a wavelength of 780 nm.

Figure 6H:
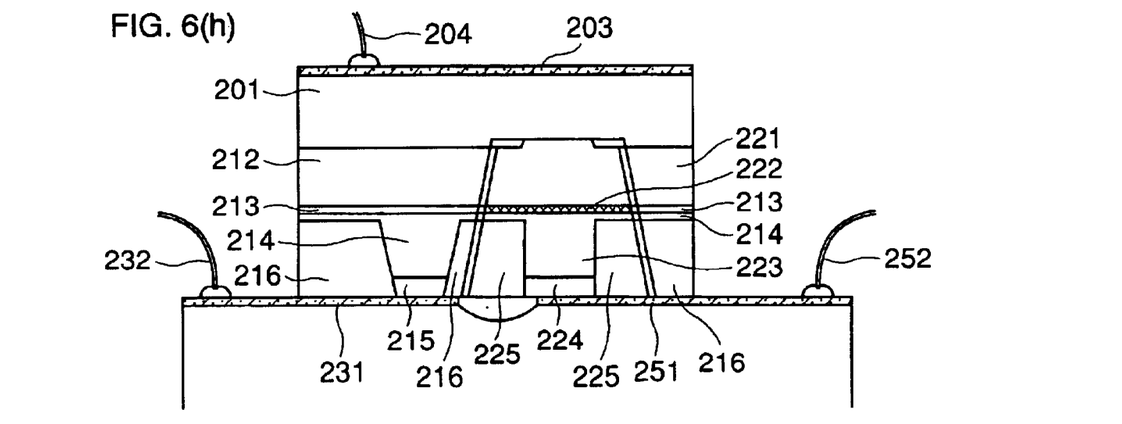

In the same manner as in the first embodiment, the electrodes 203, 231 and 251 are formed and the lead wires 204, 232 and 252 are connected thereto (see FIG. 6(h)). Consequently, a wafer is divided to carry out facet coating and package mounting. Thus, a semiconductor laser device is obtained.

In the semiconductor laser device according to the present embodiment, the second semiconductor laser resonator formed in the stripe-shaped groove 250 also has the refractive index wave-guiding type structure. Therefore, a stable optical mode can be implemented. In the present embodiment, a 650 nm light emitting portion oscillates with a threshold current of 45 mA and a 780 nm light emitting portion oscillates with a threshold current of 41 mA. Moreover, the semiconductor laser device is fused onto the heat sink 202 with a junction-down. Therefore, the active layer portion for generating heat approaches the heat sink 202. Consequently, high-temperature operating performance can be enhanced and an operation for 8,000 hours can be implemented under the condition of 70° C. and 5 mW.

In the present embodiment, the second semiconductor laser resonator with the refractive index wave-guiding type structure having the ridge type waveguide stripe has been formed in the stripe shaped groove 250. Also in the first embodiment, the second semiconductor laser resonator with a refractive index wave-guiding type structure having a ridge type waveguide stripe may be formed in the stripe-shaped groove 160.

While the semiconductor laser device has been fused onto the heat sink 202 with the junction-down in the present embodiment, the semiconductor laser device according to the first embodiment can also be fused onto the heat sink 102 with the junction-down. In that case, preferably, the heat sink 102 is composed of insulating SiC and a concave portion is provided on the surface of the heat sink 102 to form two electrically isolated electrodes, the electrodes 131 and 151 are fused corresponding to the two electrically isolated electrodes, and the lead wires 132 and 152 are connected to the electrode on the heat sink 102 side.

Thus, the stripe-shaped groove is formed in parallel with the semiconductor laser resonator having a first double hetero structure which is provided on the semiconductor substrate, the resistivity of the wall surface and bottom surface of the stripe-shaped groove are raised, the current path is formed on a part of the portion having the resistivity raised, and the semiconductor laser resonator having a second double hetero structure is formed in the stripe-shaped groove. Thus, the semiconductor laser resonator having an oscillation wavelength in an infrared region and the semiconductor laser resonator having an oscillation wavelength in a red region are formed in parallel on the same semiconductor substrate.

In the semiconductor laser device having such a structure, the semiconductor laser resonators having different double hetero structures are formed close to each other. Therefore, it is possible to greatly vary the oscillation wavelength. Consequently, wavelengths of 780 nm and 650 nm bands can be implemented and a spacing between light emitting spots can be set to 100 μm or less.

Third Embodiment

Figure 7:
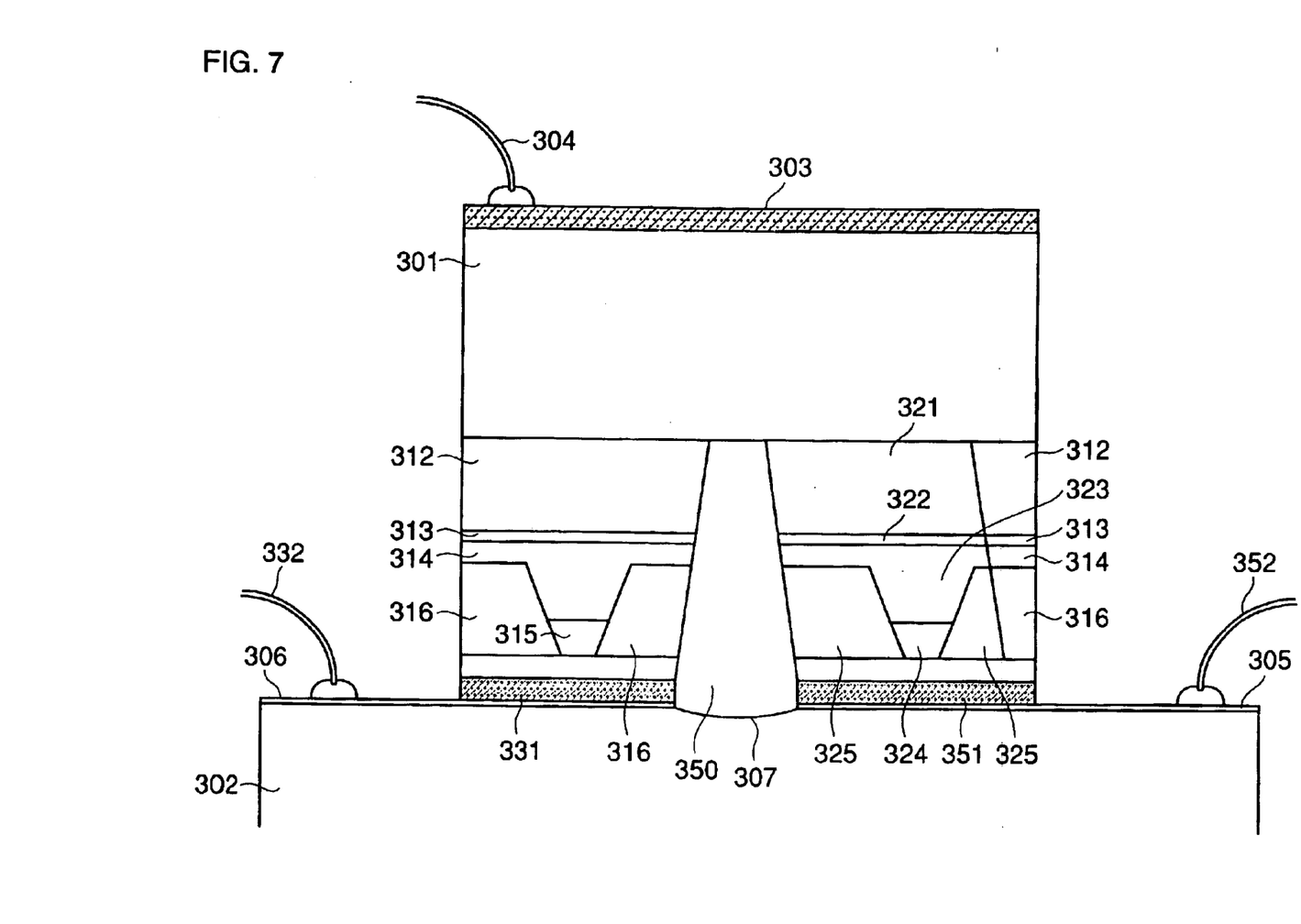
FIG. 7 is a view illustrating a section of a semiconductor laser device according to a third embodiment of the present invention.

Next, a semiconductor laser device according to a third embodiment of the present invention will be described. FIG. 7 is a view illustrating a section of the semiconductor laser device according to the third embodiment.

The semiconductor laser device has such a structure that a semiconductor laser chip is fused onto a heat sink 302 with a junction-down. The heat sink 302 is composed of insulating SiC and has a concave portion 307 formed thereon. Therefore, the surface of the heat sink 302 has two sections electrically isolated from each other.

In FIG. 7, the reference numeral 301 denotes an n-GaAs substrate, the reference numeral 312 denotes an n-AlGaAs clad layer, the reference numeral 313 denotes an MQW active layer of AlGaAs/GaAs, the reference numeral 314 denotes a p-AlGaAs clad layer, the reference numeral 315 denotes a p-GaAs cap layer, the reference numeral 316 denotes an n-AlGaAs current blocking layer, the reference numeral 350 denotes an isolating groove for insulation, the reference numeral 321 denotes an n-AlGaInP clad layer, the reference numeral 322 denotes an MQW active layer of AlGamP/GaInP, the reference numeral 323 denotes a p-AlGaInP clad layer, the reference numeral 324 denotes a p-GaAs cap layer, the reference numeral 325 denotes an n-GaAs current blocking layer, the reference numerals 303, 331 and 351 denote an electrode, the reference numerals 305 and 306 denote a Mo/Au electrode formed on the heat sink 302, the reference numeral 304 denotes a lead wire connected to the electrode 303, the reference numeral 332 denotes a lead wire connected to the electrode 331, and the reference numeral 352 denotes a lead wire connected to the electrode 351.

In the same manner as in the second embodiment, a laser resonator comprises the MQW active layer 313 of AlGaAs/GaAs which acts as a first semiconductor laser resonator and oscillates at a wavelength of 780 nm and the MQW active layer 322 of AlGaInP/GaInP which acts as a second semiconductor laser resonator and oscillates at a wavelength of 650 nm. These two laser active layers are isolated by the isolating groove 350 provided therebetween. More specifically, the two laser active layers are insulated from each other by air having a high resistivity and have the independent electrodes 331 and 351, respectively. By causing a current to flow between the electrodes 331 and 351 and the common electrode 303, therefore, it is possible to independently control light emission at wavelengths of 780 nm and 650 nm.

FIGS. 8(a)–8(d) and 9(e)–9(h) are views illustrating a method of manufacturing the semiconductor laser device according to the third embodiment. With reference to these drawings, the method of manufacturing the semiconductor laser device according to the third embodiment will be described in order of the steps.

First of all, the n-AlGaAs clad layer 312, the MQW active layer 313 of AlGaAs/GaAs, the p-AlGaAs clad layer 314 and the p-GaAs cap layer 315 are provided on the n-GaAs substrate 301 by a MOCVD method. Then, a portion other than a portion to be a ridge type waveguide stripe is removed by etching up to the middle of the p-AlGaAs clad layer 314. Next, the n-AlGaAs current blocking layer 316 is formed by the MOCVD method in the portion removed by the etching (see FIG. 8(a)). Since absorption is not carried out at the oscillation wavelength on the n-AlGaAs current blocking layer 316, laser oscillation light is not absorbed by the current blocking layer.

Figure 8A:
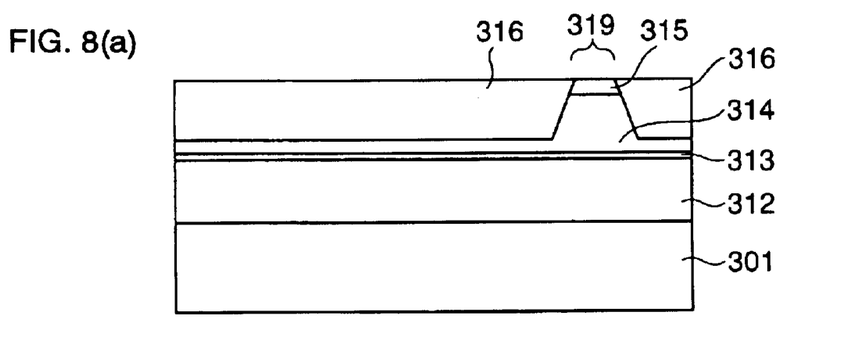
FIGS. 8(a) to 8(d) are views illustrating a method of manufacturing the semiconductor laser device according to the third embodiment of the present invention.

Consequently, a first semiconductor laser resonator portion of a real refractive index wave-guiding type which has a double hetero structure and a ridge type waveguide stripe structure is completed. The laser resonator having such a structure emits light at a wavelength of 780 nm.

Next, the formation of the second semiconductor laser resonator is prepared. First of all, an opening 349 for resonator formation which has such a depth as to reach the substrate 301 is provided adjacently to a ridge type waveguide stripe 319 (see FIG. 8(b)). The method is carried out in the following manner.

Figure 8B:
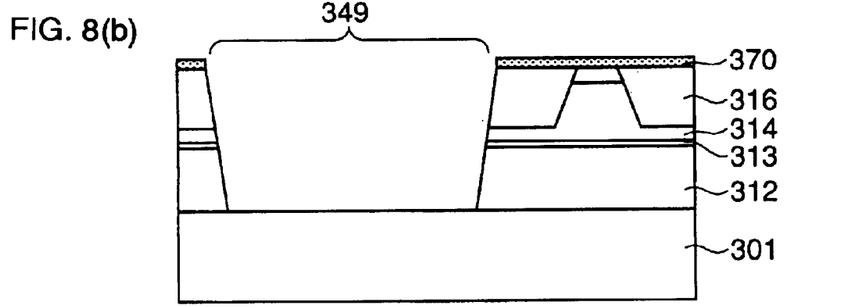

First of all, an aluminum oxide film 370 is formed by EB evaporation over the whole surface of a wafer including the first resonator. Next, a photoresist is formed on the aluminum oxide film 370. By photolithography, the photoresist in a portion corresponding to the opening 349 is removed. Then, the aluminum oxide film 370, the n-AlGaAs current blocking layer 316, the p-AlGaAs dad layer 314, the MQW active layer 313 of AlGaAs/GaAs and the n-AlGaAs clad layer 312 in the portion corresponding to the opening 349 are removed by a wet etching method. In order to stop the etching on an interface between the n-AlGaAs clad layer 312 and the n-GaAs substrate 301 without melting the aluminum oxide film 370 on the surface, a hydrochloric acid based etchant is used as an etchant. Consequently, the opening 349 is formed.

In order to enhance the morphology of the n-AlGaInP clad layer 321 to be grown later, the surface of the n-GaAs substrate 301 is rinsed with sulfuric acid (40° C., 15s).

Figure 8C:
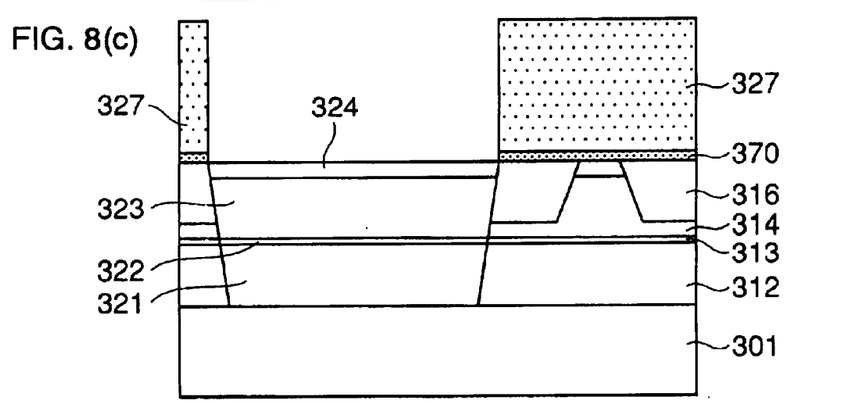
Figure 8D:
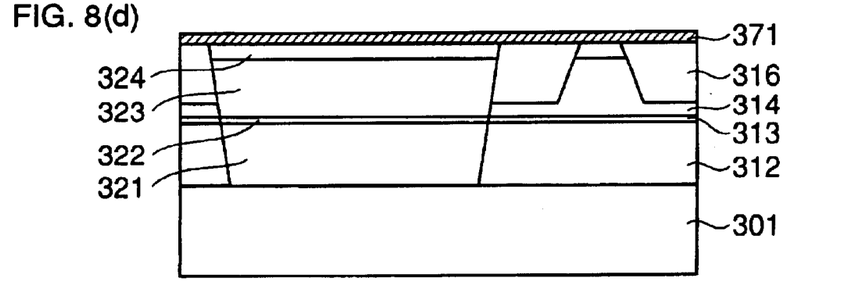

Next, the n-AlGaInP clad layer 321, the MQW active layer 322 of AlGaInP/GaInP, the p-AlGaInP clad layer 323 and the p-GaAs cap layer 324 are formed on the opening 349 and the aluminum oxide film 370 by a MBE method (see FIG. 8(c)). At this time, an undesired polycrystal layer 327 is grown on the $Al_2O_3$ film 370. The undesired layer 327 is removed by etching. By the etching removal, a photoresist is formed in a portion other than the undesired layer 327. The undesired layer 327 is removed by the etching using a sulfuric acid based etchant, a saturated bromine water based etchant and an ammonia based etchant until the $Al_2O_3$ film 370 is exposed. Then, the aluminum oxide film 370 is removed.

Subsequently, a portion of the second semiconductor laser resonator is formed. First of all, a SiNx film 371 is formed on a surface of a wafer by a p-CVD method (see FIG. 8(d)). Then, a part of an AlGaInP based hetero structure is removed by a dry etching method up to the middle of the p-AlGaInP clad layer 323 by using the SiNx film 371 as a mask by photolithography. Thus, openings 374 and 376 for the formation of the current blocking layer are provided (see FIG. 9(e)).

Figure 9E:
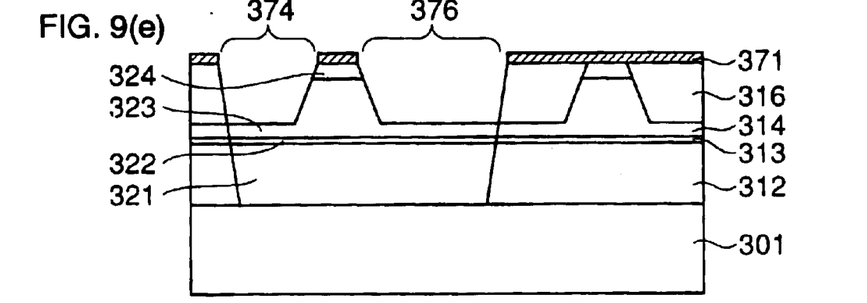
FIGS. 9(e) to 9(h) are views illustrating the method of manufacturing the semiconductor laser device according to the third embodiment of the present invention.
Figure 9F:
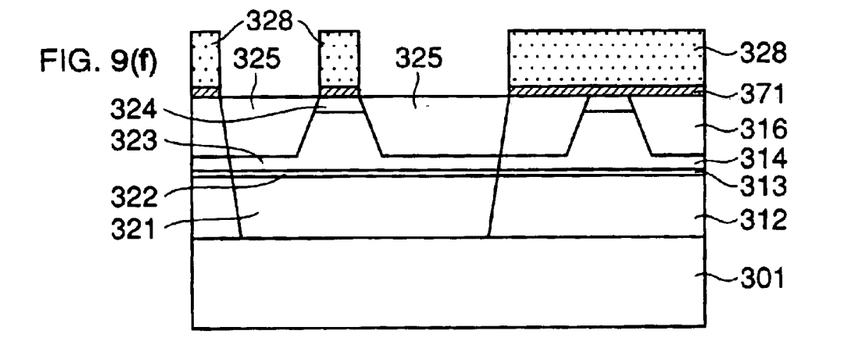

By the MBE method, the n-GaAs current blocking layer 325 is then grown on the p-AlGaInP clad layer 323 (see FIG. 9(f)). At this time, an undesired layer (polycrystalline GaAs) 328 is grown on the SiNx film 371. The undesired layer 328 is removed by etching. By the etching removal, a photoresist is formed in a portion other than the undesired layer 328, thereby removing the undesired layer 328 using the ammonia based etchant. Consequently, the portion of the second semiconductor laser resonator is completed. The portion of the second semiconductor laser resonator having such a structure emits light at a wavelength of 650 nm and the current blocking layer 325 is composed of GaAs. Therefore, an optical wave-guiding structure of a complex refractive index type can be obtained.

Figure 9G:
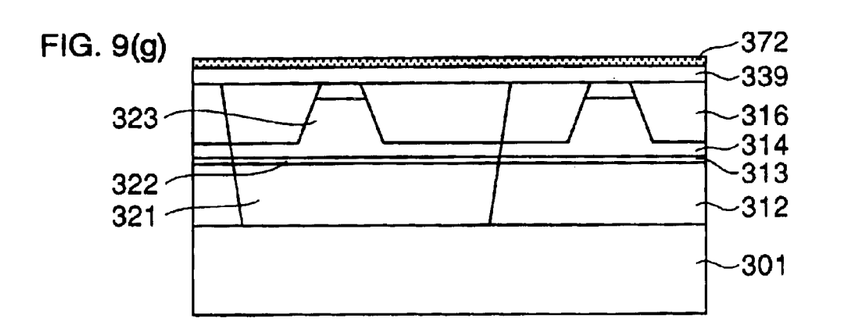

Subsequently, a contact layer 339 is formed by the MBE method, and an aluminum oxide film 372 is formed by the EB evaporation (see FIG. 9(g)).

Figure 9H:
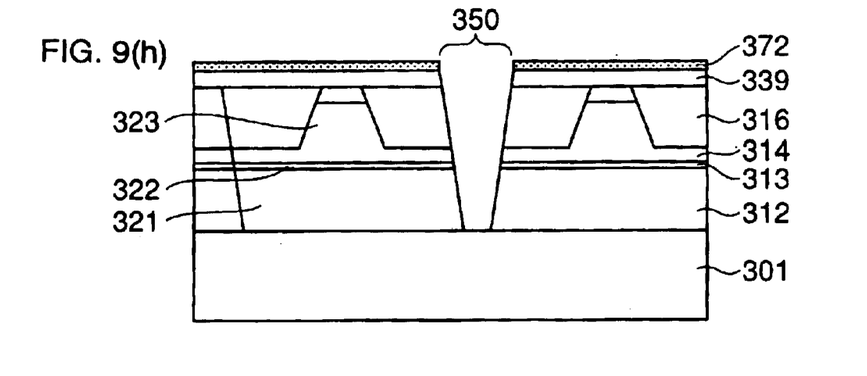

Then, an isolating groove 350 for insulation between the first resonator portion and the second resonator portion is formed by the photolithography and the dry etching method (see FIG. 9(h)). The isolating groove 350 reaches the GaAs substrate 301. Therefore, the first and second resonators are electrically insulated by air having a high resistivity.

Finally, the electrodes 303, 331 and 351 are formed and the lead wires 304, 332 and 352 are connected thereto. A wafer thus fabricated is divided to carry out facet coating and mounting on the heat sink 302 with a junction-down. Consequently, the semiconductor laser device is obtained. Since the mounting of the semiconductor laser device on the heat sink 302 with a junction-down gives high heat radiation, it is advantageous to a high output. The semiconductor laser device may be mounted on the heat sink 302 with a junction-up.

Figure 10:
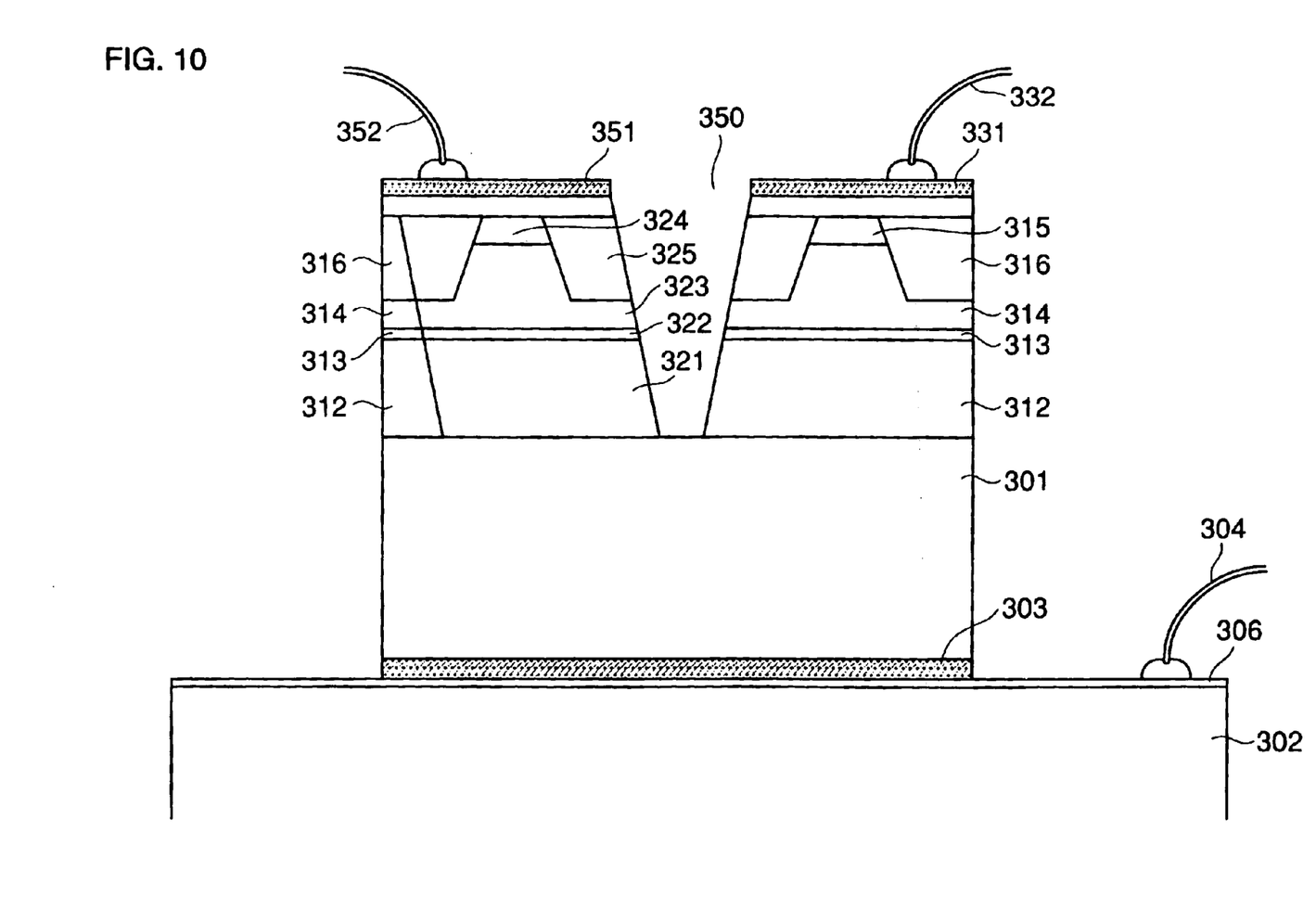
FIG. 10 is a view illustrating an example in which the semiconductor laser device according to the third embodiment of the present invention is mounted with a junction-up.

FIG. 10 is a view showing an example in which the semiconductor laser device is mounted with the junction-up.

Thus, in the case where the semiconductor laser device is mounted on the heat sink 302 with the junction-up, a wiring pattern is not required for the heat sink 302. Therefore, it is easy to carry out bonding of the lead wires 304, 332 and 352. Consequently, it is easy to assemble the device. Moreover, even if the first and second resonators have different heights from the semiconductor substrate 301 to the upper electrodes 331 and 351, the mounting on the heat sin 302 can readily be carried out.

In the semiconductor laser device thus obtained, the first resonator of a real refractive index type is realized by burying AlGaAs. A laser oscillation having a small wave-guiding loss and a low threshold is obtained from the first resonator. Moreover, the second resonator of a complex refractive index type is realized by burying GaAs and performs optical confinement based on a refractive index. Therefore, a laser oscillation having a high stability of light in a horizontal direction on the active layer is obtained from the second resonator.

In the semiconductor laser device according to the present embodiment, a 650 nm light emitting portion oscillated with a threshold current of 45 mA and a 780 nm light emitting portion oscillated with a threshold current of 38 mA. As a result of a reliability test, an operation for 9,000 hours could be implemented under the condition of 70° C. and 5 mW.

In the present embodiment, the first and second resonator portions are insulated through the isolating groove. The isolating groove does not require a large-scale apparatus for proton radiation or the like but can be formed by using the photolithography and the dry etching which have given actual results. Therefore, the isolating groove can easily be fabricated. In the first and second resonators, moreover, the current blocking layer can be formed of materials different from each other. Therefore, an optimal wave-guiding structure can be selected by the respective resonators.

While an etch stop layer has not been used when forming the ridge portion of the ridge type waveguide stripe in the present embodiment, the etch stop layer may be introduced to perform control to have a more accurate thickness.

In order to reduce an operating voltage, moreover, an intermediate bandgap layer may be provided between the n-AlGaInP clad layer 321 and the p-GaAs cap layer 324.

While the example in which the current blocking layers of the first and second resonators are composed of different materials has been described in the present embodiment, it is also possible to form both the current blocking layers of the same AlGaAs or InGaP. In that case, both the first and second resonators are of a real refractive index wave-guiding type. Therefore, it is possible to obtain a lower oscillation threshold.

Moreover, the resonator using the AlGaAs based material for the active layer has been formed earlier and the resonator using the AlGaInP based material for the active layer has been then formed adjacently to the resonator formed earlier. This order may be reversed. More specifically, it is also possible to form the resonator using the AlGaInP based material for the active layer and to then form the resonator using the AlGaAs based material for the active layer adjacently thereto.

After the first semiconductor laser resonator having an oscillation wavelength in an infrared region is thus formed, the opening is formed adjacently thereto. The second semiconductor laser resonator having an oscillation wavelength in a red region is formed in the opening and the isolating groove is formed between the both resonators. Consequently, the semiconductor laser resonator having an oscillation wavelength in an infrared region and the semiconductor laser resonator having an oscillation wavelength in a red region are formed in parallel on the same semiconductor substrate.

In the semiconductor laser device having such a structure, it is possible to form both active layers of different materials. Therefore, the oscillation wavelength can be varied greatly, wavelengths of 780 nm and 650 nm bands can be implemented, and a spacing between light emitting spots can be set to 100 μm or less. In an optical pick-up using the semiconductor laser device according to the present invention, consequently, it is possible to read and write information of both a DVD disk and a CD/CD-ROM/CD-R disk by a single pick-up. Furthermore, the semiconductor laser device according to the present invention has a flat surface. Therefore, mounting can be performed with a junction-down and the reliability of the semiconductor laser device can be enhanced at a high temperature.

Numerous modifications and alternative embodiments of the invention will be apparent to those skilled in the art in view of the foregoing description. Accordingly, this description is to be constrained as illustrative only, and is provided for the purpose of teaching those skilled in the art the best mode of carrying out the invention. The details of the structure and/or function may be varied substantially without departing from the spirit of the invention and all modifications which come within the scope of the appended claims are reserved.

What is claimed is:

1. A semiconductor laser device comprising:
   first and second semiconductor laser resonators having different light emitting active layers of materials different from each other, the semiconductor laser resonators being provided on the same semiconductor substrate so that the light emitting active layers lie substantially in parallel to a main surface of the semiconductor substrate,
   said first semiconductor laser resonator being located in a groove including a base and sidewalls, and said second semiconductor laser resonator not being located in said groove; and
   a high-resistance region in a sidewall of said groove which is provided between the semiconductor laser resonators, said high-resistance region having sufficient resistance to electrically isolate the first and second semiconductor laser resonators from one another.

2. The semiconductor laser device according to claim 1, wherein the semiconductor substrate is a GaAs substrate and the light emitting layers of the semiconductor laser resonators contain Group V elements different from each other.

3. The semiconductor laser device according to claim 2, wherein the Group V elements are selected from the group consisting of P, As, Sb and N.

4. The semiconductor laser device according to claim 1, wherein the semiconductor laser resonators comprise two resonators having oscillation wavelengths in a red region and an infrared region, respectively.

5. The semiconductor laser device according to claim 4, wherein the semiconductor substrate is a GaAs substrate, and the resonator having an oscillation wavelength in a red region includes a light emitting layer formed of an InGaP based material and the resonator having an oscillation wavelength in an infrared region includes a light emitting layer formed of a GaAs based material.

6. The semiconductor laser device according to claim 1, wherein the light emitting layers of the semiconductor laser resonators lie at substantially the same distance from the main surface of the semiconductor substrate.

7. The semiconductor laser device according to claim 1, wherein the semiconductor laser resonators each have a refractive index wave-guiding structure.

8. The semiconductor laser device according to claim 1, wherein the high resistivity region comprises a high resistivity semiconductor layer formed by implanting protons or gallium ions.

9. The semiconductor laser device according to claim 1, which is incorporated in a recording and reproducing apparatus capable of performing recording and reproduction for both a CD and a DVD.

10. A semiconductor laser device comprising:
    first and second semiconductor laser resonators provided on the same substrate, an active layer of the first laser resonator being of a different material than an active layer of the second laser resonator;
    the active layer of the second laser resonator being provided in a groove, whereas the active layer of the first laser resonator is not provided in a groove; and
    a high-resistance region provided at least along a sidewall of the groove in which the active layer of the second laser resonator is provided, the high-resistance region comprising ions and/or protons implanted into the sidewall of the groove.

11. The laser device of claim 10, wherein the active layers of the first and second resonators are of different materials at least because they contain different Group V elements.

12. The semiconductor laser device of claim 1, wherein each of said first and second semiconductor laser resonators is mounted on a heat sink having a concave portion defined in a surface thereof, each of the semiconductor laser resonators being mounted in a junction-down manner on the heat sink so that in each semiconductor laser resonator a cap layer thereof is located between the heat sink and an active layer thereof, and wherein a sidewall of said groove extends upward from the concave portion defined in the surface of the heat sink.

13. The semiconductor laser device of claim 10, wherein each of said first and second semiconductor laser resonators is mounted on a heat sink having a concave portion defined in a surface thereof, each of the semiconductor laser resonators being mounted in a junction-down manner on the heat sink so that in each semiconductor laser resonator a cap layer thereof is located between the heat sink and an active layer thereof, and so that the active layer of each semiconductor laser resonator is located between said substrate and the heat sink, and wherein a sidewall of said groove extends upward from the concave portion defined in the surface of the heat sink.

14. A semiconductor laser device comprising:
    first and second semiconductor laser resonators having different light emitting active layers of materials different from each other, the semiconductor laser resonators being provided on the same substrate so that the light emitting active layers lie substantially in parallel to a main surface of the semiconductor substrate,
    an isolating groove defined between the first and second semiconductor laser resonators for electrically isolating the first and second semiconductor laser resonators from one another;
    each of said first and second semiconductor laser resonators being mounted on a heat sink having a concave portion defined in a surface thereof, and each of the semiconductor laser resonators being mounted in a junction-down manner on the heat sink so that in each semiconductor laser resonator a cap layer thereof is located between the heat sink and an active layer thereof, and so that the active layer of each semiconductor laser resonator is located between said substrate and the heat sink; and
    wherein at least a portion of said isolating groove extends upward from the concave portion defined in the surface of the heat sink.

* * * * *